United States Patent
Fjelstad et al.

(10) Patent No.: US 6,465,878 B2
(45) Date of Patent: Oct. 15, 2002

(54) COMPLIANT MICROELECTRONIC ASSEMBLIES

(75) Inventors: Joseph Fjelstad, Sunnyvale; Konstantine Karavakis, Pleasanton, both of CA (US)

(73) Assignee: Tessera, Inc., San Jose, CA (US)

( * ) Notice: Subject to any disclaimer, the term of this patent is extended or adjusted under 35 U.S.C. 154(b) by 0 days.

(21) Appl. No.: 09/777,782

(22) Filed: Feb. 6, 2001

(65) Prior Publication Data

US 2001/0007375 A1 Jul. 12, 2001

Related U.S. Application Data

(63) Continuation of application No. 09/071,412, filed on May 1, 1998, now Pat. No. 6,284,563, which is a continuation-in-part of application No. 08/739,303, filed on Oct. 29, 1996, now Pat. No. 6,211,572

(60) Provisional application No. 60/007,128, filed on Oct. 31, 1995.

(51) Int. Cl.$^7$ ........................ H01L 23/495; H01L 23/48; H01L 23/29

(52) U.S. Cl. ..................... 257/668; 257/669; 257/690; 257/784; 257/788

(58) Field of Search ............................... 257/668, 669, 257/690, 784, 788

(56) References Cited

U.S. PATENT DOCUMENTS

| | | | | |
|---|---|---|---|---|
| 4,813,129 A | 3/1989 | Karnezos | | 29/832 |
| 4,885,126 A | 12/1989 | Polonio | | 361/399 |
| 4,902,606 A | 2/1990 | Patraw | | 430/314 |
| 5,072,520 A | 12/1991 | Nelson | | 439/74 |
| 5,148,266 A | * | 9/1992 | Khandros et al. | 357/80 |
| 5,180,311 A | | 1/1993 | Schreiber et al. | 439/74 |
| 5,666,270 A | | 9/1997 | Matsuda et al. | 361/704 |
| 5,679,977 A | | 10/1997 | Khandros et al. | 257/692 |
| 5,749,997 A | | 5/1998 | Tang et al. | 156/249 |
| 5,777,379 A | | 7/1998 | Karavakis et al. | 257/668 |
| 5,874,782 A | | 2/1999 | Palagonia | 257/778 |
| 5,885,849 A | * | 3/1999 | DiStefano et al. | 438/108 |
| 5,929,517 A | * | 7/1999 | Distefano et al. | 257/707 |
| 6,043,563 A | | 3/2000 | Eldridge et al. | 257/784 |
| 6,147,401 A | * | 11/2000 | Solberg | 257/723 |

FOREIGN PATENT DOCUMENTS

JP   57-121255   7/1982

OTHER PUBLICATIONS

"Methods of Testing Chips and Joining Chips to Substrates," 2244 Research Disclosure, Feb. 1991, Elmsworth, GB, 32290.

* cited by examiner

Primary Examiner—Eddie Lee
Assistant Examiner—Joseph Nguyen
(74) Attorney, Agent, or Firm—Lerner, David, Littenberg, Krumholz & Mentlik, LLP

(57) ABSTRACT

A microelectronic assembly includes a microelectronic element having a first surface including a central region and a peripheral region surrounding the central region, the microelectronic element including a plurality of contacts disposed in the central region. The microelectronic assembly also includes a compliant layer over the peripheral region of the first surface, the compliant layer having a bottom surface facing toward the first surface of the microelectronic element, a top surface facing upwardly away from the microelectronic element and one or more edge surfaces extending between the top and bottom surfaces. A plurality of flexible bond ribbons are disposed over the compliant layer so that the bond ribbons extend over the top surface and one or more of the edge surfaces and the bond ribbons electrically connect the contacts to conductive terminals overlying the top surface of the compliant layer.

27 Claims, 13 Drawing Sheets

COMPLIANT MICROELECTRONIC ASSEMBLIES

CROSS REFERENCE TO RELATED APPLICATIONS

The present application is a continuation of U.S. patent application Ser. No. 09/071,412, filed May 1, 1998, now U.S. Pat. No. 6,284,563 which is a continuation-in-part of U.S. patent application Ser. No. 08/739,303, filed Oct. 29, 1996, now U.S. Pat. No. 6,211,572 which, in turn, claims benefit of U.S. Provisional Application No. 60/007,128, filed Oct. 31, 1995, the disclosures of which are hereby incorporated by reference herein.

FIELD OF THE INVENTION

The present invention relates to semiconductor chip packaging. More particularly, the present invention relates to an improved compliant semiconductor package structure and methods for making the same.

FIELD OF THE INVENTION

The present invention relates to semiconductor chip packaging. More particularly, the present invention relates to an improved compliant semiconductor package structure and methods for making the same.

BACKGROUND OF THE INVENTION

Complex microelectronic devices such as modern semiconductor chips require numerous connections to other electronic components. For example, a complex microprocessor chip may require many hundreds of connections to external devices.

Semiconductor chips commonly have been connected to electrical traces on mounting substrates by one of three methods: wire bonding, tape automated bonding, and flip-chip bonding. In wire bonding, the chip is positioned on a substrate with a bottom or back surface of the chip abutting the substrate and with the contact-bearing front or top surface of the chip facing upwardly, away from the substrate. Individual gold or aluminum wires are connected between the contacts on the chip and pads on the substrate. In tape automated bonding a flexible dielectric tape with a prefabricated array of leads thereon is positioned over the chip and substrate and the individual leads are bonded to the contacts on the chip and to pads on the substrate. In both wire bonding and conventional tape automated bonding, the pads on the substrate are arranged outside of the area covered by the chip, so that the wires or leads fan out from the chip to the surrounding pads. The area covered by the subassembly as a whole is considerably larger than the area covered by the chip. This makes the entire assembly substantially larger than it otherwise would be. Because the speed with which a microelectronic assembly can operate is inversely related to its size, this presents a serious drawback. Moreover, the wire bonding and tape automated bonding approaches are generally most workable with chips having contacts disposed in rows extending along the periphery of the chip. They generally do not lend themselves to use with chips having contacts disposed in a so-called area array, i.e., a grid-like pattern covering all or a substantial portion of the chip front surface.

In the flip-chip mounting technique, the contact bearing surface of the chip faces towards the substrate. Each contact on the chip is joined by a solder bond to the corresponding pad on the substrate, as by positioning solder balls on the substrate or chip, juxtaposing the chip with the substrate in the front-face-down orientation and momentarily melting or reflowing the solder. The flip-chip technique yields a compact assembly, which occupies an area of the substrate no larger than the area of the chip itself. However, flip-chip assemblies suffer from significant problems with thermal stress. The solder bonds between the chip contacts and substrate are substantially rigid. Changes in the size of the chip and of the substrate due to thermal expansion and contraction in service create substantial stresses in these rigid bonds, which in turn can lead to fatigue failure of the bonds. Moreover, it is difficult to test the chip before attaching it to the substrate, and hence difficult to maintain the required outgoing quality level in the finished assembly, particularly where the assembly includes numerous chips.

Numerous attempts have been made to solve the foregoing problem. Useful solutions are disclosed in commonly assigned U.S. Pat. Nos. 5,148,265 and 5,148,266. Preferred embodiments of the structures disclosed in these patents incorporate flexible, sheet-like structures referred to as "interposers" or "chip carriers". The preferred chip carriers have a plurality of terminals disposed on a flexible, sheet-like top layer. In use, the interposer is disposed on the front or contact bearing surface of the chip with the terminals facing upwardly, away from the chip. The terminals are then connected to the contacts of the chip. Most preferably, this connection is made by bonding prefabricated leads on the interposer to the chip contacts, using a tool engaged with the lead. The completed assembly is then connected to a substrate, as by bonding the terminals of the chip carrier to the substrate. Because the leads and the dielectric layer of the chip carrier are flexible, the terminals on the chip carrier can move relative to the contacts on the chip without imposing significant stresses on the bonds between the leads and the chip, or on the bonds between the terminals and the substrate. Thus, the assembly can compensate for thermal effects. Moreover, the assembly most preferably includes a compliant layer disposed between the terminals on the chip carrier and the face of the chip itself as, for example, an elastomeric layer incorporated in the chip carrier and disposed between the dielectric layer of the chip carrier and the chip. Such a compliant structure permits displacement of the individual terminals independently towards the chip. This permits effective engagement between the subassembly and a test fixture. Thus, a test fixture incorporating numerous electrical contacts can be engaged with all of the terminals in the subassembly despite minor variations in the height of the terminals. The subassembly can be tested before it is bonded to a substrate so as to provide a tested, known, good part to the substrate assembly operation. This in turn provides very substantial economic and quality advantages.

Commonly owned U.S. Pat. No. 5,455,390 describes a further improvement. Components according to preferred embodiments of the '390 patent use a flexible, dielectric top sheet having top and bottom surfaces. A plurality of terminals are mounted on the top sheet. A support layer is disposed underneath the top sheet, the support layer having a bottom surface remote from the top sheet. A plurality of electrically conductive, elongated leads are connected to the terminals on the top sheet and extend generally side by side downwardly from the terminals through the support layer. Each lead has a lower end at the bottom surface of the support layer. The lower ends of the leads have conductive bonding materials as, for example, eutectic bonding metals. The support layer surrounds and supports the leads.

Components of this type can be connected to microelectronic elements such as semiconductor chips or wafers by juxtaposing the bottom surface of the support layer with the contact-bearing surface of the chip so as to bring the lower ends of the leads into engagement with the contacts on the chip, and then subjecting the assembly to elevated temperature and pressure conditions. All of the lower ends of the leads bond to the contacts on the chip substantially simultaneously. The bonded leads connect the terminals of the top sheet with the contacts on the chip. The support layer desirably is either formed from a relatively low-modulus, compliant material, or else is removed and replaced after the lead bonding step with such a compliant material. In the finished assembly, the terminals desirably are movable with respect to the chip to permit testing and to compensate for thermal effects. However, the components and methods of the '390 patent provide further advantages, including the ability to make all of the bonds to the chip or other component in a single lamination-like process step. The components and methods of the '390 application are especially advantageous when used with chips or other microelectronic elements having contacts disposed in an area array.

Despite the positive results of the aforementioned commonly owned inventions, still further improvements would be desirable.

SUMMARY OF THE INVENTION

The present invention contemplates a method of creating a compliant semiconductor chip package assembly and the semiconductor chip package assembly created therefrom.

In a fabrication process according to one aspect of the invention, a first dielectric protective layer is provided on a contact bearing surface of a semiconductor chip. The semiconductor chip has a central region bounded by the chip contacts and a set of apertures. The apertures in the dielectric protective layer are provided such that the chip contacts are exposed. This first dielectric protective layer may actually be the silicon dioxide passivation layer of the semiconductor chip.

Second, a compliant layer, preferably consisting of silicone, flexibilized epoxy, a thermosetting polymer or polyimide is provided atop the first dielectric protective layer is provided within the central region. The compliant layer is formed such that it has a substantially flat top surface and edges that gradually slope down to the top surface of the first dielectric protective layer. The sloping edges of the compliant layer may be manufactured to have a first transition region near the top surface of the compliant layer and a second transition region near the bottom surface of the compliant layer such that both the first transition region and the second transition region have a radius of curvature.

Finally, bond ribbons are selectively formed atop both the first dielectric protective layer and the compliant layer such that each bond ribbon electrically connects each chip contact to a respective terminal position on the compliant layer. The bond ribbons may be selectively formed using a variety of techniques, such as by electroplating or by electroless plating followed by selective etching. The terminal positions are the conductive elements that connect the finished assembly to a separate substrate, e.g. a printed circuit board.

The method described above may further include the step of providing for a second dielectric protective layer atop the bond ribbons and the compliant layer after the bond ribbon electroplating step is performed. This optional second dielectric protective layer is fabricated with a set of apertures that expose the underlying terminal positions on the compliant layer.

Additionally, the method described above may further include the optional step of providing for an encapsulant layer above the bond ribbons. If this optional step is performed, it is performed after the step of selectively electroplating the bond ribbons. Like the first dielectric layer, the encapsulant layer is fabricated with a set of apertures so that the terminal positions are exposed. The encapsulant layer material consists preferably of either a curable liquid, such as silicone, a flexibilized epoxy or a gel. This optional step may also be performed just prior to the optional step of providing for a second dielectric protective layer.

In another aspect of the invention, a method of making a compliant microelectronic assembly includes providing a microelectronic element, such as a semiconductor chip, having a first surface and a plurality of contacts disposed on the first surface thereof and forming a compliant layer over the first surface of the microelectronic element. The compliant layer typically has a bottom surface facing toward the first surface of the microelectronic element, a top surface facing upwardly away from the microelectronic element and one or more edge surfaces extending between the top and bottom surfaces. The edge surfaces of the compliant layer are preferably sloping surfaces which extend in both vertical and horizontal directions. At least some of the sloping edge surfaces preferably have first transition regions near the top surface of the compliant layer and second transition regions near the bottom surface of the compliant layer, the first and second transition regions having respective radii of curvature.

In certain embodiments, before the compliant layer is formed, a first dielectric protective layer, such as a layer including a silicon dioxide passivation layer, may be provided on the first surface of the microelectronic element. The first dielectric protective layer may have a plurality of apertures therein so that the contacts are accessible therethrough. The compliant layer described above can then be provided over the dielectric protective layer.

Bond ribbons may then be selectively formed over the compliant layer. The bond ribbons preferably extend over both the top surface of the compliant layer and one or more edge surfaces of the compliant layer. The bond ribbons electrically connect the contacts to conductive terminals overlying the top surface of the compliant layer. Before the bond ribbons are formed, a barrier metal layer may be deposited over the contacts so as to prevent undesired chemical reactions between the contacts and the bond ribbons. In one embodiment, the bond ribbons are formed by selectively electroplating the bond ribbons atop the first dielectric protective layer and the compliant layer. After the bond ribbons have been formed, a dielectric cover layer may be formed over the compliant layer and the bond ribbons. The dielectric cover layer may have a plurality of apertures therein so that the terminals are accessible therethrough. In other embodiments, an encapsulant layer may be provided atop the exposed surfaces of the bond ribbons. The encapsulant layer is generally a material selected from the group consisting of silicone, flexibilized epoxy, thermoplastic and gel. Next, a second dielectric protective layer or cover layer may be provided over the encapsulant layer. The second dielectric protective layer also preferably has a plurality of apertures therein so that the terminals are accessible therethrough.

The compliant layer may include one or more apertures therein so that the contacts are accessible through the apertures. The one or more apertures may include one or more groups of apertures encompassing a plurality of the contacts. The edge surfaces of the compliant layer may include one or more aperture edge surfaces bounding the apertures, with at least some of the bond ribbons being formed over the aperture edge surfaces. The compliant layer may be formed by engaging the microelectronic element with a mold so that one or more projections on the mold contact the first surface of the microelectronic element. A flowable composition may be introduced around the projections and the flowable composition set to provide a compliant layer. The microelectronic layer may then be separated from the mold. The one or more apertures are typically formed in the space occupied by the projections.

In certain embodiments, the contacts on the microelectronic element are disposed in an area array, and the one or more apertures in the compliant layer include a plurality of apertures disposed in an array corresponding to the array of contacts so that each contact is encompassed in a respective aperture. In other embodiments, the contacts on the microelectronic element may be disposed in a first region of the first surface, with the compliant layer overlying a second region of the first surface, and one or more edge surfaces including one or more border edge surfaces extending along one or more borders between the first and second regions. In still other embodiments, the contacts on the microelectronic element are disposed in a central region of the first surface and the compliant layer overlies a peripheral region of the first surface.

In another embodiment, a method of making a compliant microelectronic package includes providing a supporting element having an upwardly-facing top surface and juxtaposing a microelectronic element including a first surface having a plurality of contacts thereon with the supporting element so that the first surface of the microelectronic element is disposed alongside the top surface of the supporting element. The first surface of the microelectronic element and the top surface of the supporting element may be substantially coplanar after the juxtaposing step.

A compliant layer may then be provided over the top surface of the supporting element, the compliant layer having a top surface remote from the top surface of the supporting element, a bottom surface and an edge surface extending between the top surface and the bottom surface. In certain embodiments, a portion of the compliant layer extends over the first surface of the microelectronic element, with one or more edge surfaces of the compliant layer overlying the first surface of the microelectronic element. Bond ribbons may then be selectively formed atop the compliant layer, the bond ribbons electrically interconnecting the contacts of the microelectronic element with conductive terminals overlying the top surface of the compliant layer.

The supporting structure described above may have a central aperture therein so that the microelectronic element may be placed in the central aperture after being juxtaposed with the supporting element. After the juxtaposing step, the first surface of the microelectronic element and the top surface of the supporting structure are preferably substantially coplanar.

In certain embodiments, the compliant chip assembly may include a ground plane electrically interconnected with at least one of the bond ribbons. The ground plane may include a plurality of apertures therein so that the terminals are accessible through the apertures.

The methods described above can be applied simultaneously to a multiplicity of undiced semiconductor chips on a wafer to form a corresponding multiplicity of compliant semiconductor chip packages. After the bond ribbons have been formed on the packages, individual packages may be severed or diced from the wafer to provide separate and distinct chip packages. The methods may also be applied to a multiplicity of adjacent semiconductor chips arranged in an array to form a corresponding multiplicity of compliant semiconductor chip packages, whereby the packages are diced after the bond ribbons have been formed.

A further aspect of the present invention includes the structure of a unique compliant semiconductor chip package having fan-in type leads. The compliant semiconductor chip package is comprised of (1) a semiconductor chip having a plurality of peripheral bonding pads on a face surface thereof and a central region bound by the peripheral bonding pads; (2) a first dielectric protective layer having a first surface, a second surface and apertures, wherein the first surface of the first dielectric layer is joined to the face surface of the semiconductor chip and the peripheral bonding pads are exposed through the apertures; (3) a compliant layer having a top surface and a bottom surface, wherein the bottom surface of the compliant layer is joined to the second surface of the first dielectric layer within the central region of the semiconductor chip package; and (4) a plurality of electrically conductive bond ribbons, each bond ribbon having a first end that electrically couples to a respective peripheral bonding pad of the semiconductor chip and a second end that joins to the top surface of the compliant layer to form a package terminal.

The package terminals of the completed package are configured in an array that has an area smaller than the area bound by the peripheral bonding pads on the face of the semiconductor chip. In other words, the package has fan-in leads that permits minimization of the overall package size.

For increased reliability, the compliant layer has sloped peripheral edges so that the overlying bond ribbons are curved rather than kinked.

The compliant semiconductor chip package may also have a compliant layer characterized by an array of bumped protrusions. The bumped protrusions support the overlying conductive terminal position ends of the bond ribbons and function as conductive balls that join to a substrate thus forming a ball grid array type interconnection. Alternate to the bumped protrusions, the compliant layer may have an array of concavities that are useful for placement of solder balls into each concavity. This arrangement is also useful for a ball grid array type interconnect.

The foregoing and other objects and advantages of the present invention will be better understood from the following Detailed Description of a Preferred Embodiment, taken together with the attached figures.

DETAILED DESCRIPTION OF A PREFERRED EMBODIMENT

FIGS. 1A–F illustrate a side view of the process of creating the compliant chip package of the present invention on the face surface of a single die, on the face surfaces of multiple die arranged in a coplanar array or on the face surface of an undiced silicon wafer which may be subsequently diced into individual packaged chips or multi-chip modules.

Figure 1A:
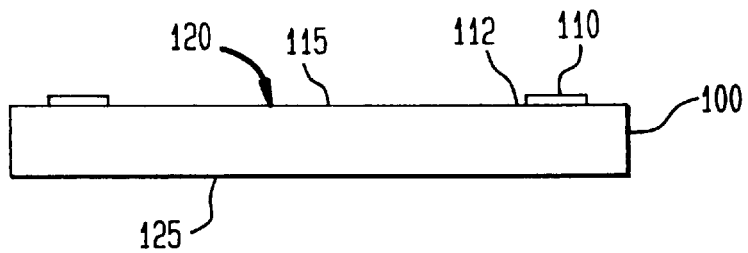
FIG. 1A is a cross-sectional view of a semiconductor chip assembly at the beginning of a fabrication process.
Figure 1B:
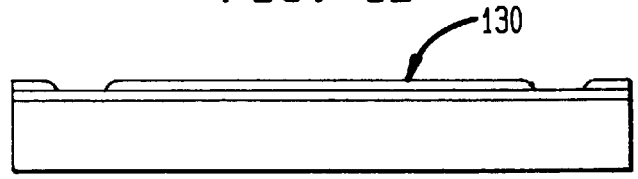
FIG. 1B is a cross-sectional view of the semiconductor chip assembly after a first step of the fabrication process, showing a deposited or laminated dielectric passivation layer.

FIG. 1A shows a single semiconductor chip 100 with a contact bearing face surface 120. The contacts 110 on the face surface 120 are typically aligned in a peripheral region 112 and further define a central region 115 therein. In FIG. 1B, a dielectric passivation layer is deposited or adhered onto the face surface 120 of the chip 100. The passivation layer may simply be the SiO$_2$ passivation layer (not shown) commonly found on the contact bearing surface of semiconductor chips, or a separate dielectric passivation layer 130 may be used, such as an epoxy resin, a polyimide resin, photo-imagable dielectric, etc. If the separate passivation layer 130 is used, the passivation layer 130 may be spun onto and built up to a planar sheet-like form on the face surface 120 or a dielectric sheet may be laminated to the face surface 120 using any of a number of electronic grade adhesives commonly known and used by those skilled in the art. The passivation layer 130 covers the face surface 120 of the chip 100 while leaving the chip contacts 110 exposed so that a bond ribbon may be plated thereon in a later step, as described below. Typically, this will be done by depositing or adhering the passivation layer 130 in a continuous sheet on the face surface 120 of the chip 100. A registering system, such as an automatic vision system, is used to locate the contacts 110. If a photo-imagable dielectric is used, the passivation layer 130 may be exposed and developed without exposing the area above the contacts 110, that unexposed area may then be removed. Another removal process which can be used is to use a pulse of directed energy, such as an excimer laser, to selectively remove the passivation layer 130 above the contacts 110. Alternately, a continuous dielectric sheet already having set contact holes may be registered and laminated to the chip 100.

Figure 1C:
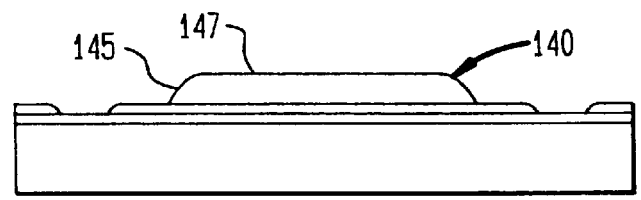
FIG. 1C is a cross-sectional view of the semiconductor chip assembly after a second step of the fabrication process, showing a deposited or laminated compliant layer within the central region of the semiconductor chip contact-bearing surface.

In the next step, as illustrated in FIG. 1C, a compliant layer 140 is deposited or laminated onto the exposed surface of the passivation layer 130. The compliant layer 140 may be stenciled, screened or transfer molded onto the passivation layer 130 using a curable liquid which, when cured, adheres to the passivation layer 130. Alternately, the compliant layer 140 may be adhered to the exposed surface of the passivation layer 130 in the form of cured compliant pads using the aforementioned electronic grade adhesives. The compliant layer 140 has a substantially flat top surface 147 which further typically has a gradual, sloping transition 145 between the face surface 120 of the chip 100 and the top surface 147. This transition 145 may follow a line of curvature from the passivation layer 130 to a substantially flat top surface 147 or may simply be canted at an angle such that the transition 145 is not too vertically oriented in relation to the passivation layer 130 and the top surface 147. The compliant layer 140 itself may be formed from a wide variety of materials; however, preferably, a low modulus of elasticity material is used as the compliant layer 140. Compliant interposers typically are fabricated from polymeric and other materials such as silicones, flexibilized epoxy, polyimides and other thermosetting polymers, fluoropolymers and thermoplastic polymers. Also, the interposer may be a composite incorporating plural materials. The interposer may consist of, or incorporate, a foam or mesh layer. The flexibility of the interposer depends on the thickness and configuration of the interposer, as well as on the properties of the materials used therein. Thus, a flexible interposer, capable of buckling or wrinkling to accommodate relative movement, can be fabricated from high elastic modulus materials, normally considered as "rigid" provided that these materials are present in thin layers. Relatively soft materials and foams can be used in greater thicknesses and still provide a highly flexible interposer. Moreover, such soft materials and foams provide a highly compliant interposer, i.e., an interposer which is readily compressible in the directions perpendicular its surfaces and which therefore permits movement of the terminals in these directions.

Figure 1D:
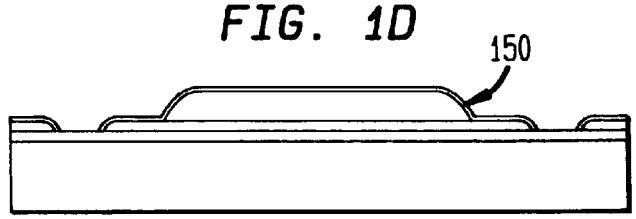
FIG. 1D is a cross-sectional view of the semiconductor chip assembly after a third step of the fabrication process, showing a conductive seed layer that has been sputtered over the assembly.
Figure 1E:
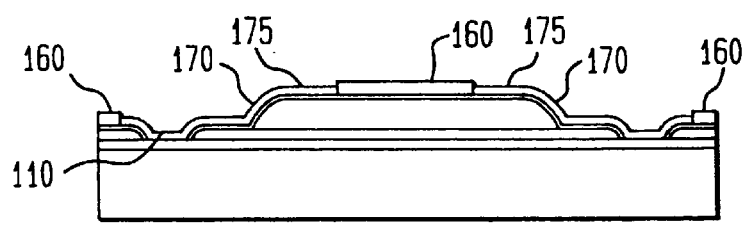
FIG. 1E is a cross-sectional view of the semiconductor chip assembly after a fourth step of the fabrication process, illustrating how after a photolithographic step conductive bond ribbons can be formed over the assembly.
Figure 2:
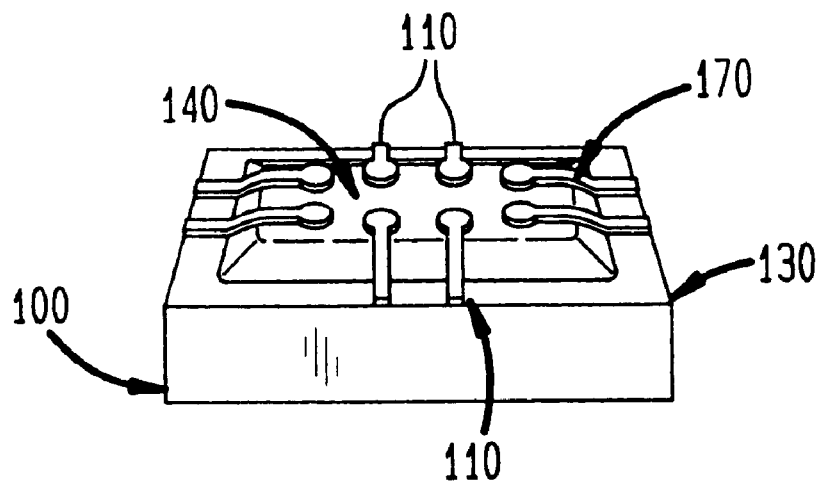
FIG. 2 is a perspective view of the semiconductor chip assembly after the bond ribbons have been formed over the compliant layer but before the second dielectric protective layer is coated.

A plating seed layer 150 is then deposited atop the aforementioned assembly, as shown in FIG. 1D, typically using a sputtering operation. Typical plating seed layer materials include palladium (for electroless plating), titanium, tungsten, nickel, chromium; however, primarily copper seed layers are used. FIG. 1E shows the next step in which photoresist 160 is applied to the exposed top surfaces of the assembly and then exposed and developed such that bond ribbons 170 may be plated within defined areas to form conductive paths electrically connecting the chip contacts 110 near a first end region of the ribbons 170 to terminals 175 comprising the second end region of the ribbons 170. This is perhaps more easily seen in the perspective view shown in FIG. 2. As shown, the ribbons 170 are plated directly onto the contacts 110 and extend in a "fan-in" arrangement from the peripheral region 112 to the central region 115 of the face surface 120 of the chip 100 atop the compliant layer 140. Possible bond ribbon materials include copper, gold, nickel, and alloys, combinations and composites thereof, among others. Since the bond ribbons 170 are plated directly onto the chip contact/compliant layer themselves, there is no need to develop a process for bonding the ribbons 170 to the contacts, as is necessary with most other approaches such as TAB, beam lead or wirebonding. This provides a significant cost savings because specialized thermocompression or ultrasonic bonders and their bonding tools need not be purchased or maintained. It is important, however, that the material selected for the bond ribbon 170 be compatible with the chip contact 110 material, which is typically aluminum. Otherwise, a phenomenon called Kirkendahl Voiding (voids created at the boundary of two metals having different interdiffusion coefficients) may cause voiding along the boundary of the two metals (ribbon/contact) leading to intermetallic degradation and embrittlement of the bond ribbon 170 itself making the lead/bond susceptible to failure during thermal cycling. Alternately, one or more barrier metals may be plated atop the chip contacts 110 prior to the bond ribbon plating step to thereby ensure the compatibility of materials.

Figure 1F:
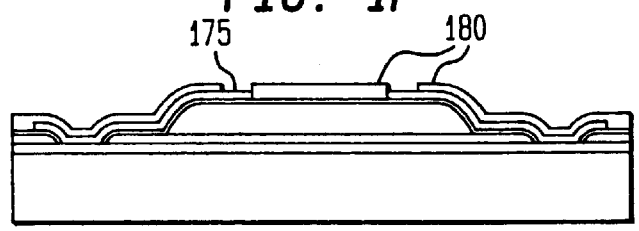
FIG. 1F is a cross-sectional view of the semiconductor chip assembly after a fifth step of the fabrication process, showing how the assembly is coated with a second dielectric protective layer.

As shown in FIG. 1F, preferably, a dielectric layer 180 is deposited or laminated over the top of the assembly so that only the terminals 175 are exposed. The dielectric layer may be comprised of a screened, exposed and developed or laminated sheet photo resist material or may be comprised of paralyne, epoxy resin, polyimide resin, fluoropolymer, etc. which is deposited or laminated on to the assembly, as described above in relation to the passivation layer 130. The terminals 175 may then be electrically connected to a circuitized substrate, such as a printed wiring board.

Typically, a solder ball or a solid-core solder ball will be used to create this electrical connection. The dielectric layer 180 is thus used as a solder mask to ensure that the solder does not electrically short between adjacent bond ribbons 170. Oxide layers and other surface contaminates typically build up on the surface of many types of metal (copper, nickel, etc.). Although not shown in FIG. 1F, the terminals 175 are typically flash plated with a thin layer of gold (approximately 0.25 to 0.5 microns) to inhibit the formation of these oxide layers. The gold layer is kept very thin so that it does not appreciably affect the aforementioned solder joint by dissolving into the solder to an amount which would embrittle the resulting solder joint between the terminal and a circuitized substrate.

The configuration of the above described chip package allows the package to mechanically decouple the chip 100 from an attached circuitized substrate (not shown). Typically, solder connections between the chip and the circuitized substrate are woefully inadequate to compensate for the thermal mismatch problem during temperature cycling of the chip. The combination of the compliant layer 140 and the flexible bond ribbons plated thereon allow the package to compensate for much of the TCE mismatch problem by giving limited movement of the terminals in the X, Y and Z directions with respect to the chip contacts 110 thereby minimizing the stress placed on the solder connections themselves, without imposing substantial forces on the bond between the ribbons 170 and the chip contacts 110. Further, because the compliant layer 140 is compressible, it also has the effect of compensating for any terminals 175 which are not perfectly planar with respect to its adjacent terminals when the terminals 175 are abutted against and coupled to the circuitized substrate. However, the top surface 147 of the compliant layer 140 should be made as flat and planar as possible so that the terminals 175 all lie in or near the same plane in order to minimize the amount of pressure needed to be placed on the bottom surface 125 of the chip 100 to ensure that all of the terminals/solder balls are electrically connected to a circuitized substrate.

Figure 3:
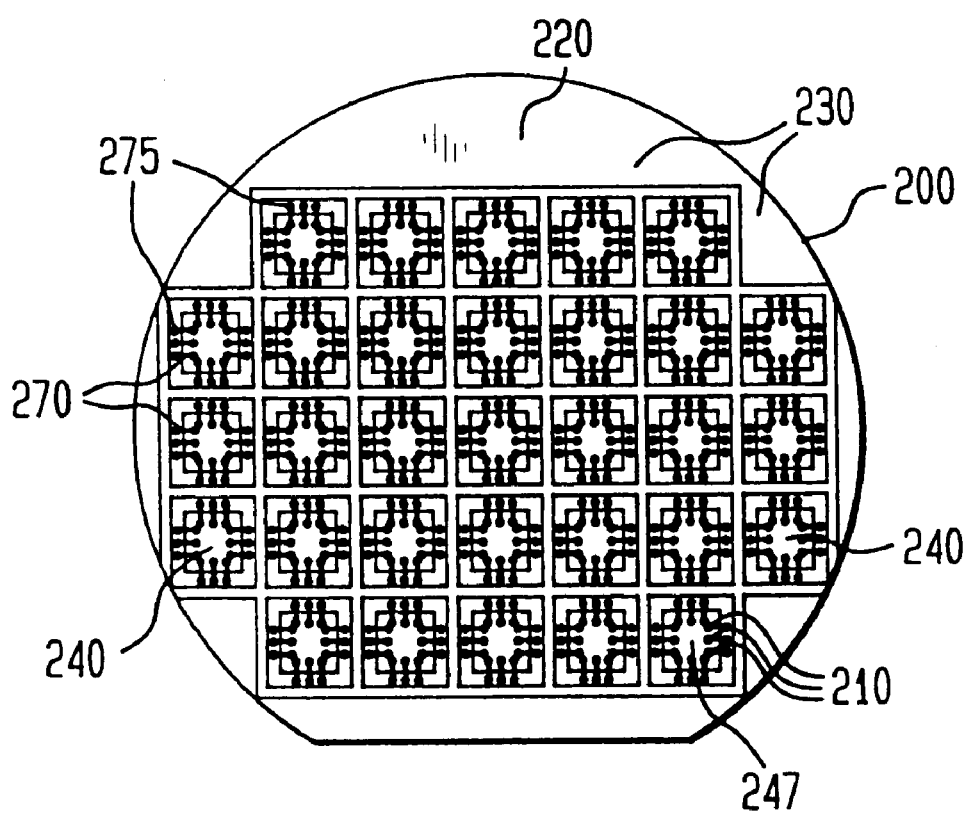
FIG. 3 is a plan view of a wafer having a multiplicity of semiconductor chips, illustrating how said multiplicity of semiconductor chips can be simultaneously packaged using the semiconductor chip assembly process depicted in FIGS. 1A–1F.

As illustrated in FIG. 3, the chip package described above in relation to FIGS. 1 and 2 may also be provided in the form of a multiplicity of packages on a wafer incorporating a plurality of individual, undiced chips, all of the same design or of differing designs. As shown, an array of individual passivation layers 230 may be deposited or laminated onto the face surface 220 of the wafer 200 leaving the chip contacts 210 of the various individual chips exposed, as described above. This arrangement is shown to better define the individual chips within the wafer. Preferably, however, a single passivation layer 230 is deposited or laminated onto the face surface 220 leaving the contacts 210 exposed. Individual compliant layers 240, as described above, are deposited or laminated onto the central regions of each of the individual chips within the wafer 200. The steps found in FIG. 1A–F are then performed, as described above, to create a plurality of connected individually packaged chips on the face surface 220 of the wafer 200. Each packaged chip having bond ribbons 270 which are connected at one end to contacts 210 and extending in to a central region of the respective chip in a fan-in fashion atop a respective compliant layer 240 and ending with a terminal 275 on the top surface 247 of the compliant layer 240. After the individual packages are completed, the individual chips may be separated from the wafer 200 and from one another, as by cutting the wafer 200 using conventional wafer severing or "dicing" equipment commonly utilized to sever wafers into individual chips. This procedure yields a plurality of packaged chip subassemblies, each of which may be secured to an individual circuitized substrate. Alternately, the chips may be separated from the wafer 200 in multi-chip arrangements of multiples of the same or different operational chips. The wafer level embodiment shown in FIG. 3 could be simulated using a panel of individual chips spaced apart from one another in a processing boat. The face surfaces of the individual chips would be coplanar with respect to one another to simulate the face surface 220 of the wafer 200. The chips above described steps would be performed and the chips would be separated if desired.

Figure 4:
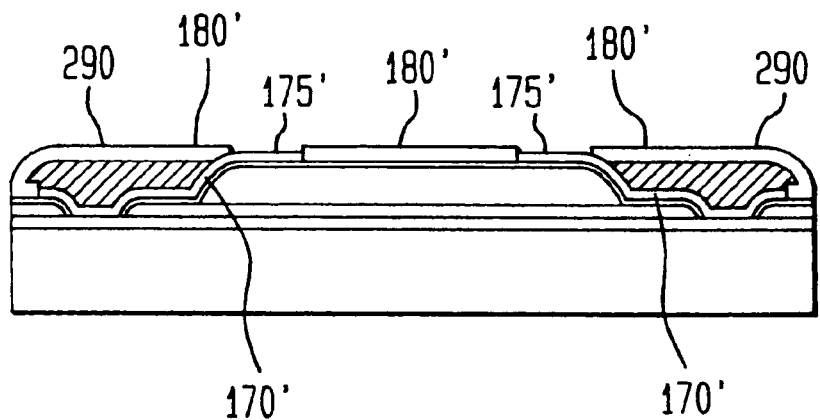
FIG. 4 is a cross-sectional view of an alternate embodiment of the present invention, illustrating the use of a low modulus encapsulant material to provide further support and stress relief to the bond ribbons.

In the alternate embodiment shown in FIG. 4, a low modulus encapsulant material 290 may be deposited around the exposed surfaces of the bond ribbons 170' leads prior to the step shown in FIG. 1F of depositing or laminating the assembly with the dielectric layer 180'. The encapsulant material 290 may have properties similar to those of rubber, gum or gel. Typical encapsulation materials include curable liquid or cured pads comprised of silicone, flexibilized epoxy, gels, thermoplastics, etc. If the encapsulant 290 is applied as a curable liquid, a fixture may be made such that the liquid flows around the bond ribbons 170' but does not flow on top of the terminals 175' to ensure that solder balls may be subsequently electrically connected to the terminals 175', as described above. Alternately, a machine such as a Camalot 1818 manufactured by Camalot Systems, Inc. of Havermill, Mass. may be used to flow the liquid encapsulant into the desired areas. After the liquid is deposited, it may be cured by any number of ways depending on the encapsulant material 290 used, e.g. heat, infrared energy, etc. The encapsulant 290 gives each of the bond ribbons 170' more support and further spreads some of the stress away from the ribbons 170' thus allowing a larger TCE mismatch between the chip and a circuitized substrate, as described above. After curing of the encapsulant 290, the dielectric layer 180' may be deposited or laminated thereto.

In another alternate embodiment, a conductive material such as beryllium copper, or a super plastic or shape memory alloy (such as Nitinol), is sputtered or otherwise deposited across the entire exposed surface of the chip/passivation layer/compliant layer (100/130/140) combination, shown in FIG. 1C. The conductive material may then be etched using industry standard photolithographic techniques resulting in a multiplicity of bond ribbons positioned and configured much like the bond ribbons 170 shown in FIG. 1E and FIG. 2. In this embodiment, as described above, a barrier metal, such as a flash plated layer of gold, may first be plated to the chip contacts to ensure compatibility of the electrical connection between the chip contact and the bond ribbon. Likewise, a flash plated layer of gold may be plated atop the exposed surface of the terminal. Also, the entire exposed surface of the bond ribbon could be plated with a thin layer of gold to increase the overall conductivity of such super plastic leads. A dielectric layer is next deposited or laminated as shown in FIG. 1F.

Figure 5A:
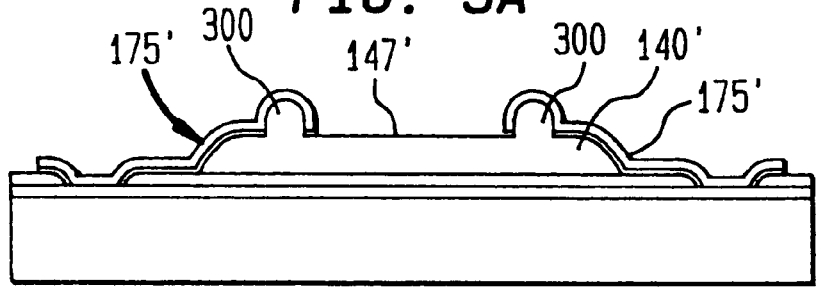
FIG. 5A is a cross-sectional view of an alternate embodiment of the present invention, illustrating the formation of bumped protrusions in the compliant layer that raise the overlying terminals such that the terminals form an array over the top surface of the compliant layer.
Figure 5B:
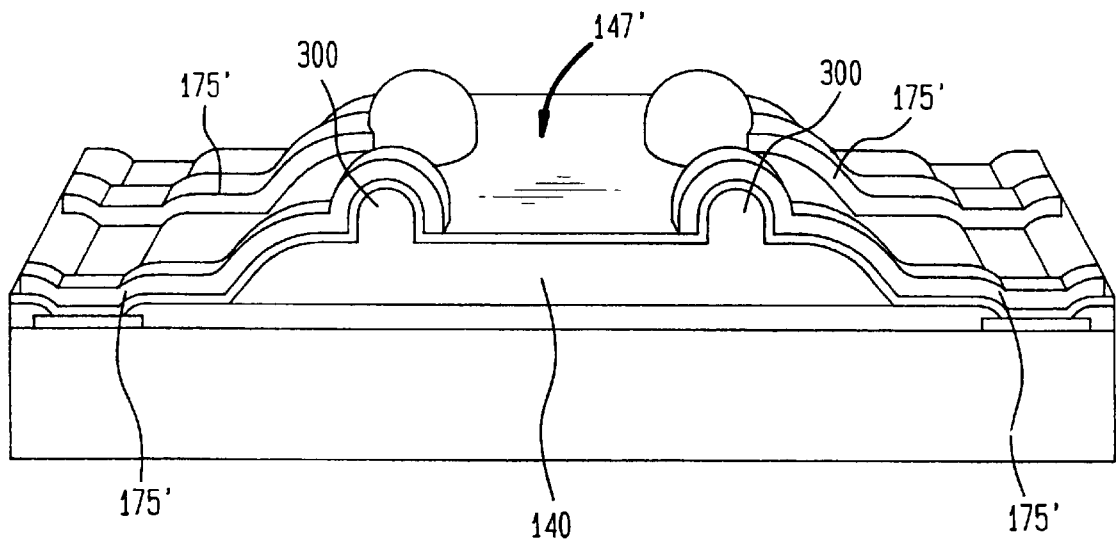
FIG. 5B is a perspective view of the embodiment shown in FIG. 5A.

FIG. 5A shows a side view and FIG. 5B a perspective view of another embodiment, according to the present invention. In this embodiment, the compliant layer 140' has protrusions 300 on its top surface 140'. These protrusions 300 may be integral with the compliant layer 140' or may be deposited or laminated onto the top surface 140' subsequent to the formation of the compliant layer 140'. The protrusions 300 may be formed of compliant, elastomeric material, such as the material comprising the compliant layer 140', or may be comprised of a semi-rigid or rigid material. The bond ribbon terminals 175' are plated on top of the protrusions 300 thereby providing raised surfaces which may be connected to a circuitized substrate. This technique allows for connection to such a substrate using less solder and without the need to accurately position solid-core solder balls.

Figure 6A:
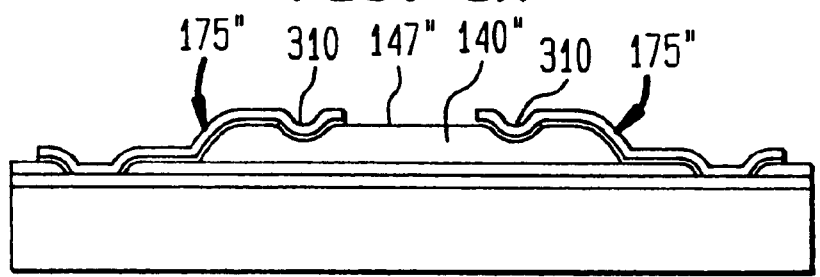
FIG. 6A is a cross-sectional view of an alternate embodiment of the present invention, illustrating the formation of concave areas in the compliant layer such that the overlying terminals have cup-like depressions useful for accurate placement of solder balls.
Figure 6B:
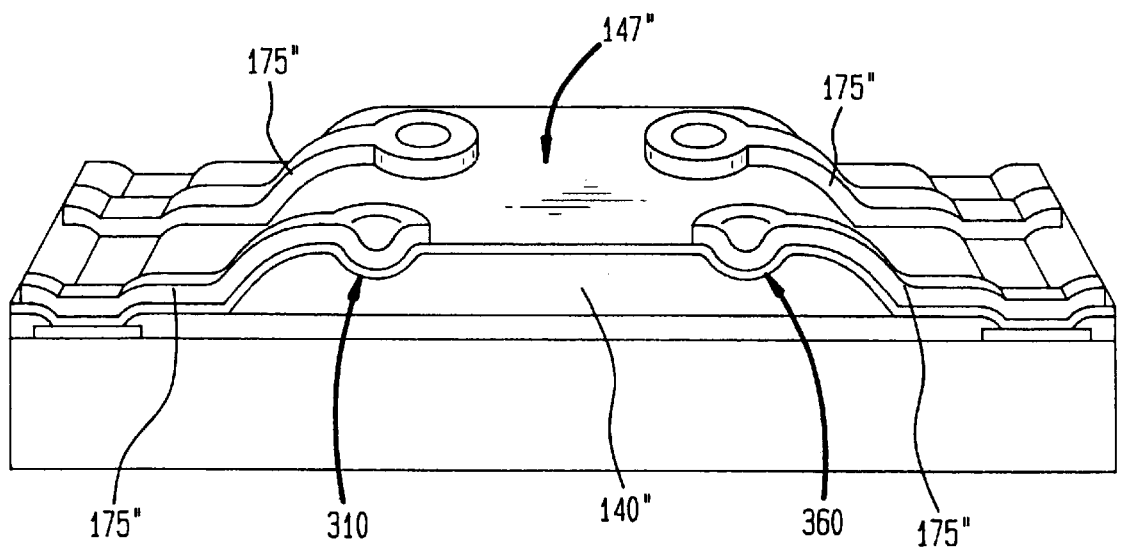
FIG. 6B is a perspective view of the embodiment shown in FIG. 6A.

FIG. 6A shows a side view and FIG. 6B a perspective view of another embodiment, according to the present invention. In this embodiment, concave areas 310 are created in the compliant layer 140". These concave areas 310 may be create in the formation of the compliant layer 140" or may be created subsequent to the formation of the compliant layer 140". The bond ribbon terminals 175" are plated within the concave areas 310 creating conductive "cup-like" areas on the top surface 147" of the compliant layer 140". Solder or solid-core solder balls are then placed within these areas 310 and reflowed to attach the package to a circuitized substrate, as described earlier. This technique allows for the accurate placement of solder or solid-core solder balls by allowing them to be deposited and retained within the cup-like areas.

FIGS. 7A–7D illustrate a side view of a method of making a compliant microelectronic package including a semiconductor chip having an area array of contacts on a first surface thereof. The package is preferably assembled by using the method steps described above.

Figure 7A:
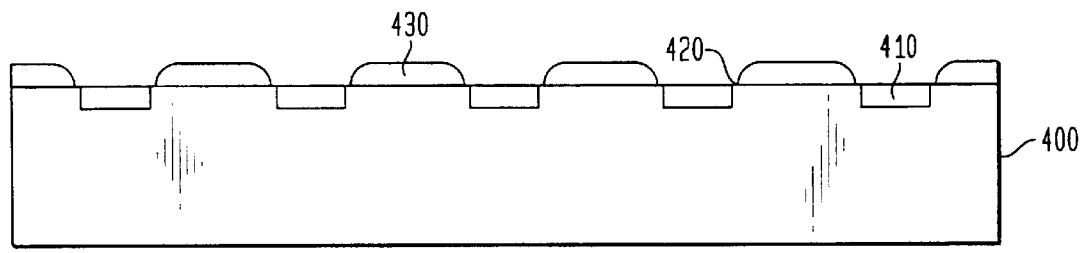
FIG. 7A is a cross-sectional view of a first step of a semiconductor chip assembly process according to another embodiment of the present invention.

FIG. 7A shows a single semiconductor chip 400 having a first surface 420 including a plurality of contacts 410 provided in an area array over the first surface 400. A dielectric passivation layer 430 is deposited over the first surface 420 of the chip 400 and preferably covers the first surface 420 of the chip 400 while leaving the chip contacts 410 exposed so that a bond ribbon (not shown) may be plated thereon, as will be described in more detail below.

Figure 7B:
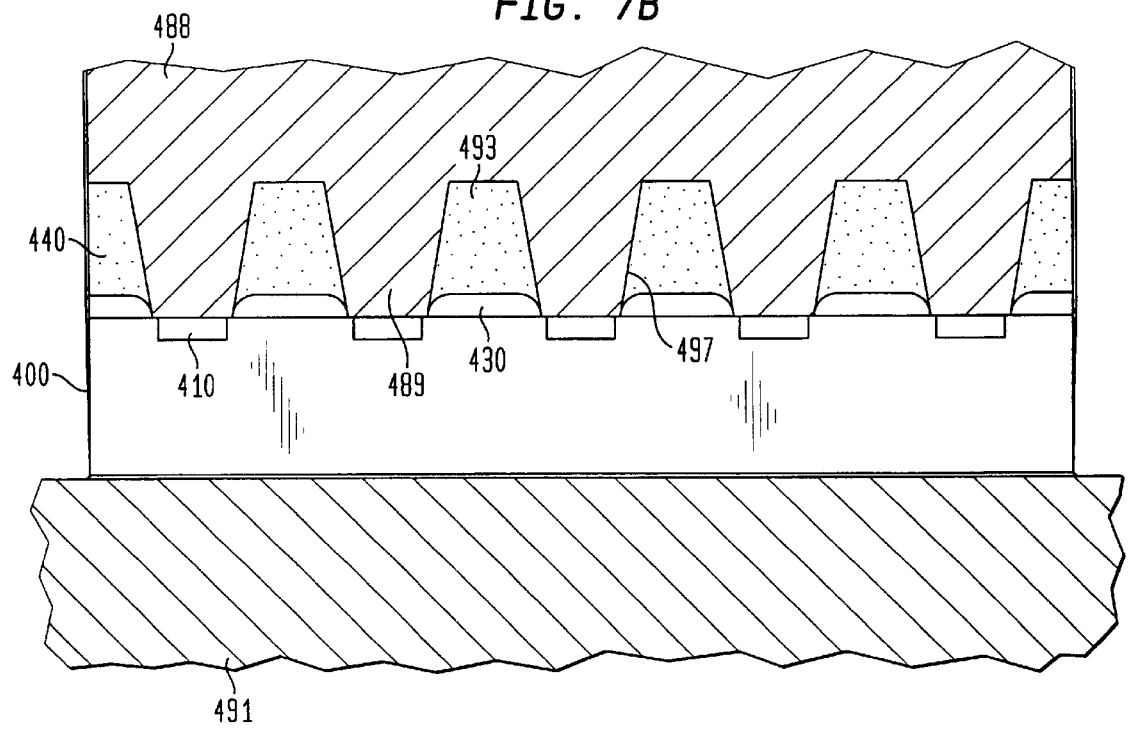
FIG. 7B is a cross-sectional view of the assembly shown in FIG. 7A, showing a mold for forming a compliant layer on top of the assembly.

Next, as illustrated in FIG. 7B, the chip 400, including the passivation layer 430, is placed in a mold 488 so that a compliant layer may be formed atop the passivation layer 430. The compliant layer 440 is preferably molded onto the passivation layer 430 using a curable liquid which, when cured, adheres to the passivation layer 430. In one preferred embodiment, the mold 488 has downwardly extending projections 489 which are shaped to completely cover the chip contacts 410 when the mold 488 is in a closed position. The mold 488 includes open spaces 493 between the projections 489. In order to form the compliant layer 440, the chip 400 is placed in a frame 491 and the mold is closed on top of the chip 400 so that the projections 489 completely cover the contacts 410. Next, a curable liquid 440 is introduced into the mold and fills the open spaces 493 between the projections 489. The curable liquid is then cured while the mold remains in the closed position so as to form the compliant layer 440 having a substantially flat top surface 447 including a plurality of openings 495 aligned with the contacts 410. The height of projections 489 is exaggerated in FIG. 7 for clarity of illustration. In practice, projections 489 typically are about 75–200 microns high, and hence compliant layer 440 typically is about 74–200 microns thick. In each opening 495 has a gradual sloping edge 497 or transition between the first surface 420 of the chip 400 and the top surface 447 of the compliant layer 440. This sloping edge 497 will preferably follow a line of curvature from the passivation layer 430 to the substantially flat top surface 447, or may simply be canted at an angle such that the sloping edge 497 is not too vertically oriented in relation to the passivation layer 430 and the top surface 447 of the compliant layer. For example, sloping edge 497 typically is disposed at an angle of about 20–70° to the plane of the chip front surface, and more typically about 40–60°. Also, the sloping surface typically is curved to define a radius at the juncture of sloping surface 497 and top surface 447. A further radius or fillet can be provided at the junction of the sloping surface and the front surface of the chip.

Figure 7C:
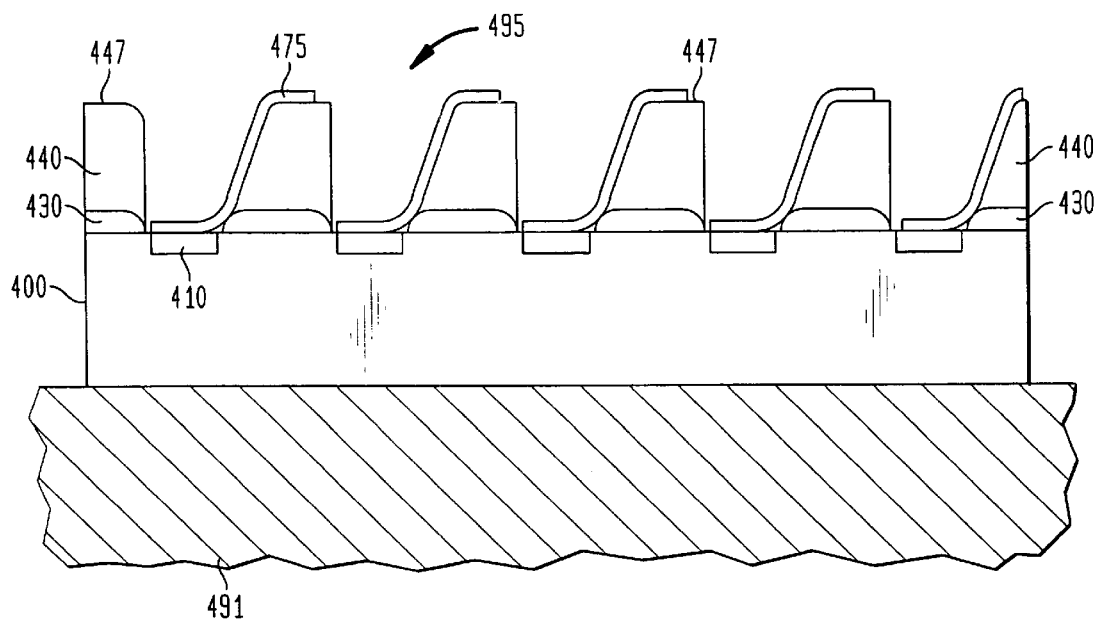
FIG. 7C is a cross-sectional view of the assembly shown in FIG. 7B after conductive bond ribbons have been formed atop the compliant layer.
Figure 8A:
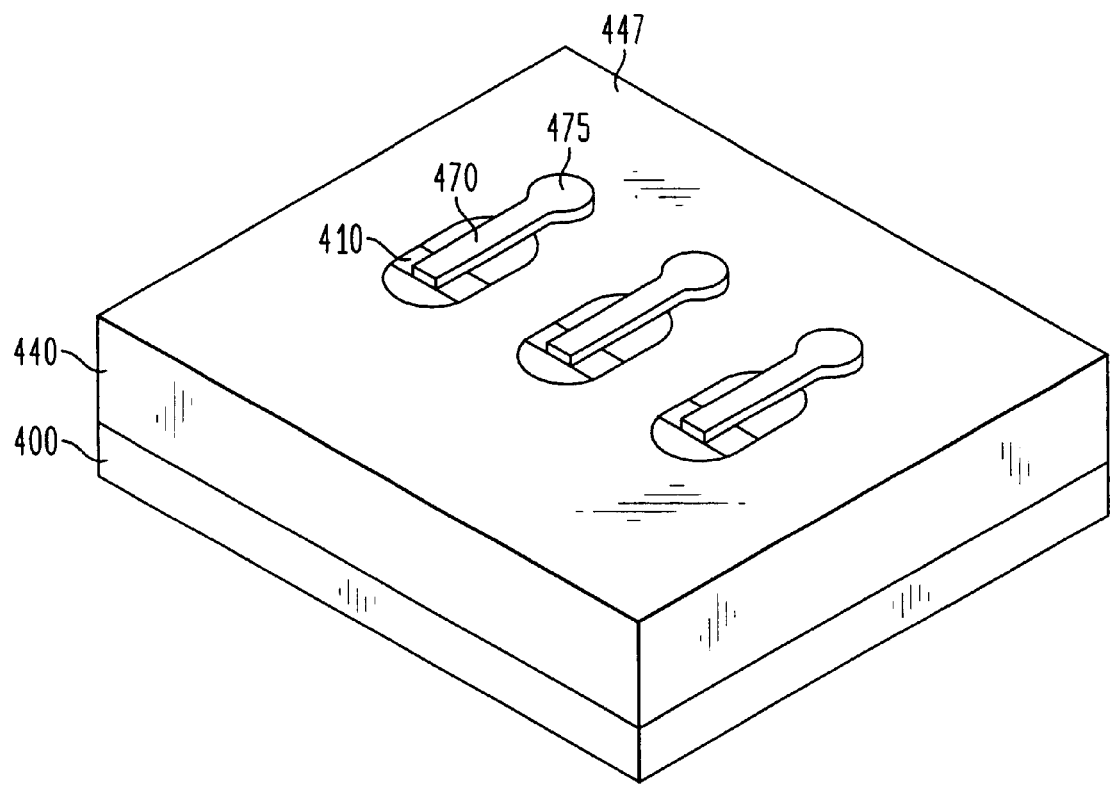
FIG. 8A is a perspective view of the semiconductor chip assembly shown in FIG. 7C, before the additional dielectric protective layer has been provided over the bond ribbons.

In the next step, illustrated in FIG. 7C, bond ribbons 470 are selectively formed within defined areas to create conductive paths electrically connecting the chip contacts 410 near a first end of the bond ribbons 470 to conductive terminals 475 at a second end of the bond ribbons. In certain embodiments, the bond ribbons 470 may be formed using selective electroplating or other selective deposition techniques. In other embodiments, the selection forming step used to make bond ribbons 470 may include one or more nonselective deposition techniques such as electroless plating or sputtering of a conductive layer over the assembly, with or without an additional non-selective electroplating step, followed by selectively etching of the conductive layer to provide electrically isolated bond ribbons. FIG. 8A shows a perspective view of the bond ribbons after they have been selectively formed over the compliant layer. In alternative embodiments, one or more barrier metal layers (not shown) may be plated atop the chip contacts 410 prior to forming the bond ribbons 470 so as to insure the compatibility of materials.

Figure 7D:
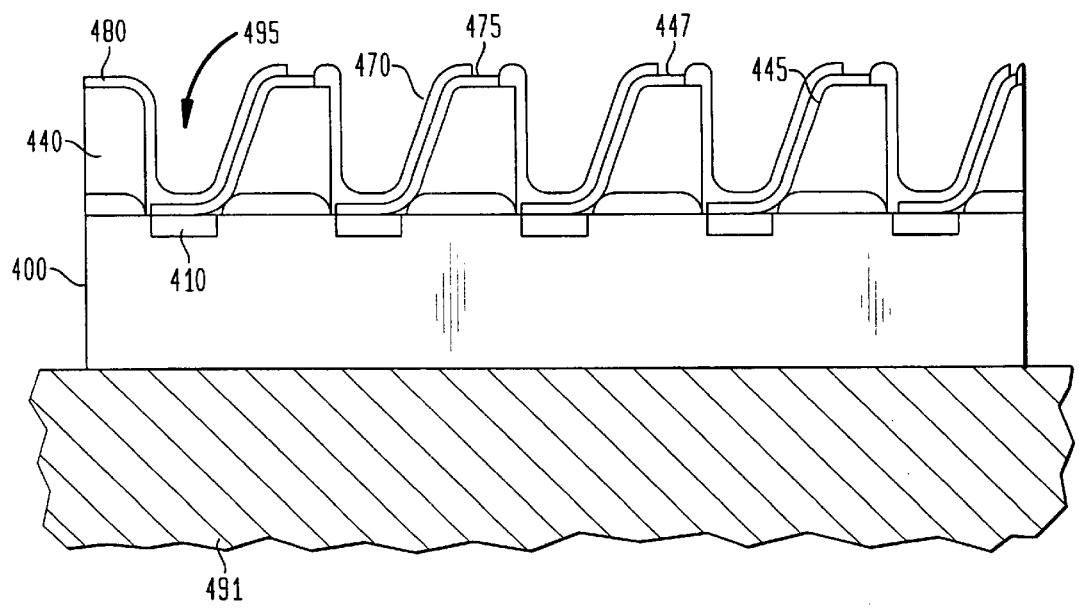
FIG. 7D shows the assembly of FIG. 7C after the top of the assembly has been coated with an additional dielectric protective layer.

Referring to FIG. 7D, a dielectric layer 480 is then deposited or laminated over the top of the assembly so that only the conductive terminals 475 are accessible at the top of the assembly. The terminals 475 may then be electrically interconnected with an external circuit element, such as a printed circuit board. Typically, a solder ball or solid core solder ball will be used to create this electrical connection. Thus, the dielectric layer 480 serves as a solder mask, thereby insuring that the solder does not electrically short between adjacent bond ribbons 470.

Figure 8B:
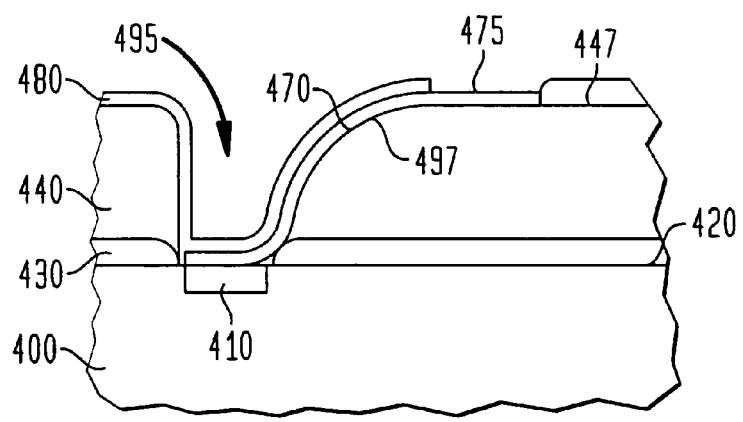
FIG. 8B is a close-up, fragmentary, cross-sectional view of the assembly shown in FIG. 7D.

FIG. 8B shows a close-up, fragmentary, cross-sectional view of FIG. 7D. The assembly includes the compliant layer 440 having a plurality of apertures 495 therein so the contacts 410 are accessible through the apertures 495. Each aperture 495 in the compliant layer 440 preferably includes at least one sloping edge side wall 497 which provides a gradual sloping transition between the first surface 420 of the chip 400 and the top surface 447 of the compliant layer 440. The transition preferably follows a line of curvature from the passivation layer 430 to the top surface 447 or may simply be canted at an angle so that the transition from the first surface 420 of the chip 400 to the top surface 447 of the compliant layer 440 is not too vertically oriented in relation to the passivation layer 430. The top surface 447 of the passivation layer is preferably substantially flat, however, in certain embodiments the top surface 447 may be slightly rounded. As stated above, the low points in the compliant layer may next be filled with compliant material to encase the leads and/or cover sheets of material.

Figure 9:
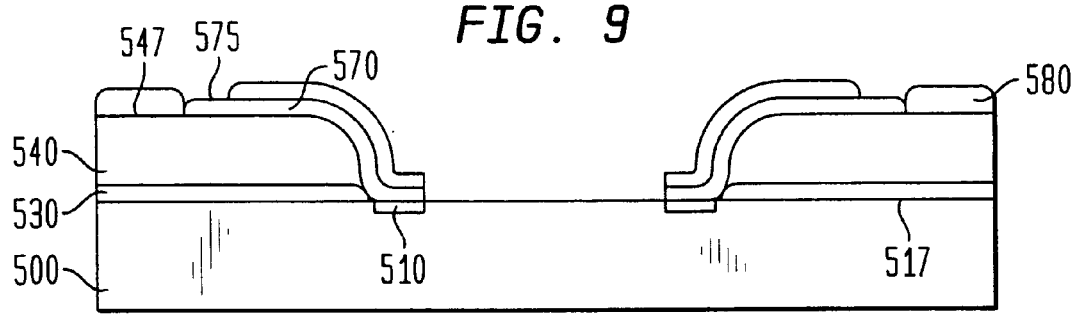
FIG. 9 is a cross-sectional view of another embodiment of the present invention which includes a semiconductor chip having a plurality of contacts in a central region thereof.

As illustrated in FIG. 9, a compliant chip package in accordance with another preferred embodiment of the present invention includes a single semiconductor chip 500 having a first surface 520 with a first or central region 515 and a second or peripheral region 517 surrounding the central region 515. The chip 500 includes a plurality of contacts 510 disposed in the central region 515 thereof. A passivation layer 530 is preferably deposited over the first surface 520 of the chip 500. The passivation layer 530 includes apertures aligned with the contacts 510 so that the chip contacts 510 are accessible through the passivation layer 530. A compliant layer 540 is then formed over the passivation layer, the compliant layer having openings 595 in alignment with the chip contacts 510 so that the contacts are accessible through the compliant layer openings 595. The steps described above are then performed to create a plurality of bond ribbons 570 which are connected at one end to the chip contacts 510 and at a second end to conductive terminals 575 accessible at the substantially flat surface 547 of the compliant layer 540. The final assembly provides a compliant chip package having a plurality of contacts 510 in the central region 515 thereof and bond ribbons 570 extending outwardly from the contacts 510 to conductive terminals 575 overlying the peripheral region 517 of the chip 500. The centrally located low point in the compliant layer can be filled in with compliant material to encapsulate the leads.

Figure 10:
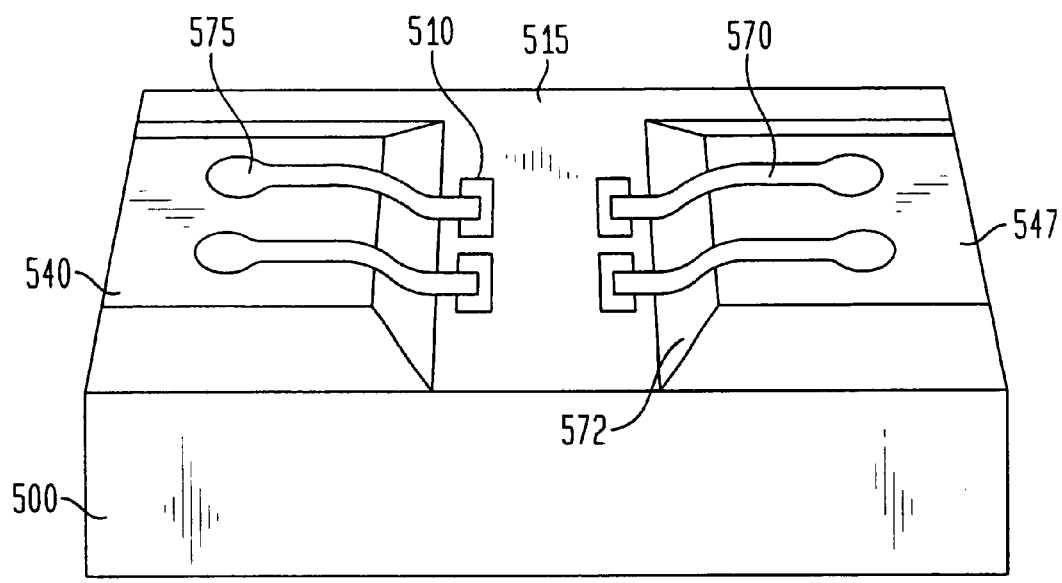
FIG. 10 is a perspective view of the assembly shown in FIG. 9.

FIG. 10 shows a perspective view of the package illustrated in FIG. 9. As shown in FIG. 10, the plurality of contacts 510 are located in the central region 515 of the chip 500. Compliant layer 540 defines two sloping edges 572 at the border of the first or central region of the chip surface and the second or peripheral region. Bond ribbons 570 have first ends electrically connected to the contacts 510 and second ends extending to conductive terminals 575 provided at the top surface 547 of the compliant layer 540. The specific embodiment shown in FIG. 10 includes a compliant layer 540 having a first section on the left side of the chip 500 and a second section on the right side of the chip 500, however, other preferred embodiments may include compliant layers having more than two distinct portions.

Figure 11:
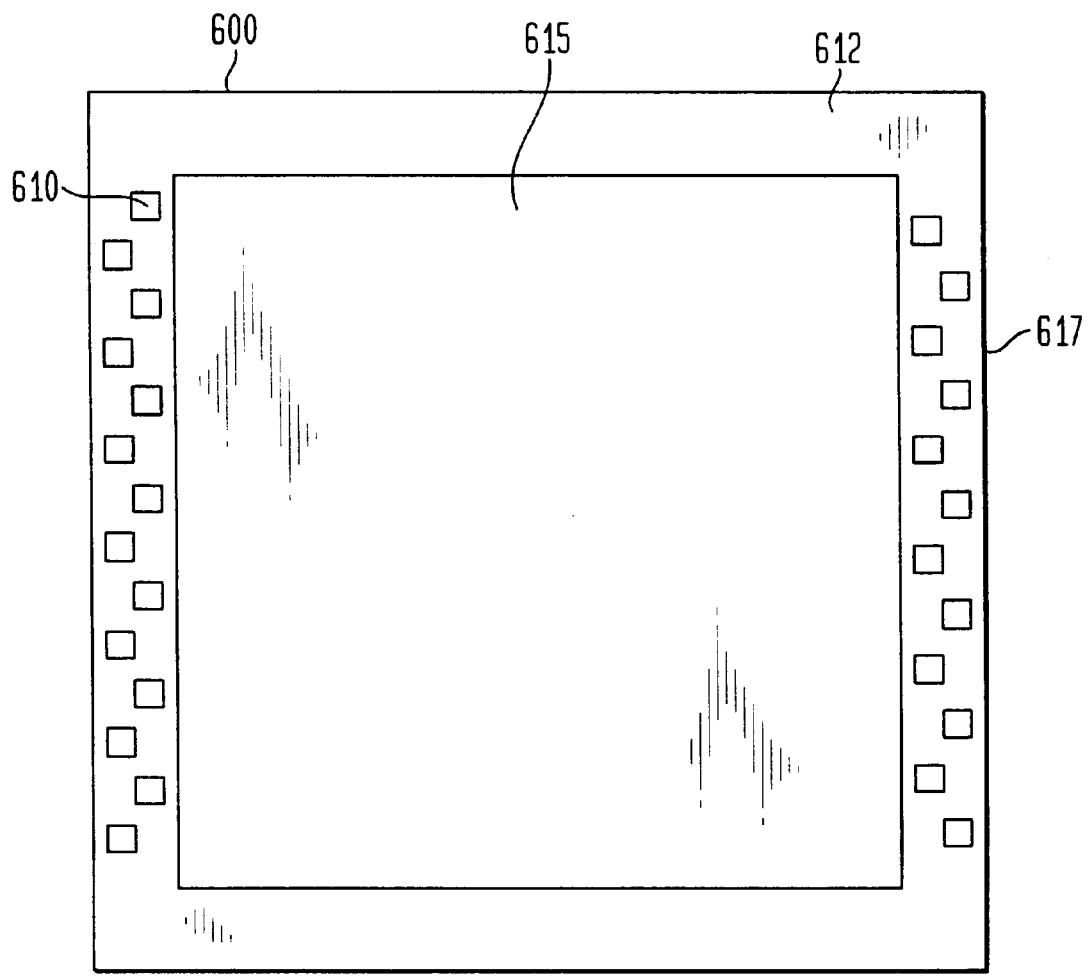
FIG. 11 is a top view of a semiconductor chip having a plurality of non-uniform, staggered chip contacts in a peripheral region of a semiconductor chip, in accordance with another embodiment of the present invention.

In still another embodiment, illustrated in FIG. 11, a compliant chip package includes a semiconductor chip 600 having a first surface with a central region 615 and a peripheral region 612 surrounding the central region 615. The peripheral region 612 includes a plurality of contacts 610 which are arranged in a staggered or non-uniform configuration. In other words, the peripheral region 612 includes contacts 610 which are positioned at non-uniform distances from an edge 617 of the chip 600. In other embodiments, the chip may include contacts clumped together in groups and/or disposed in a non-uniform pattern throughout the entire first surface of the chip.

Figure 12:
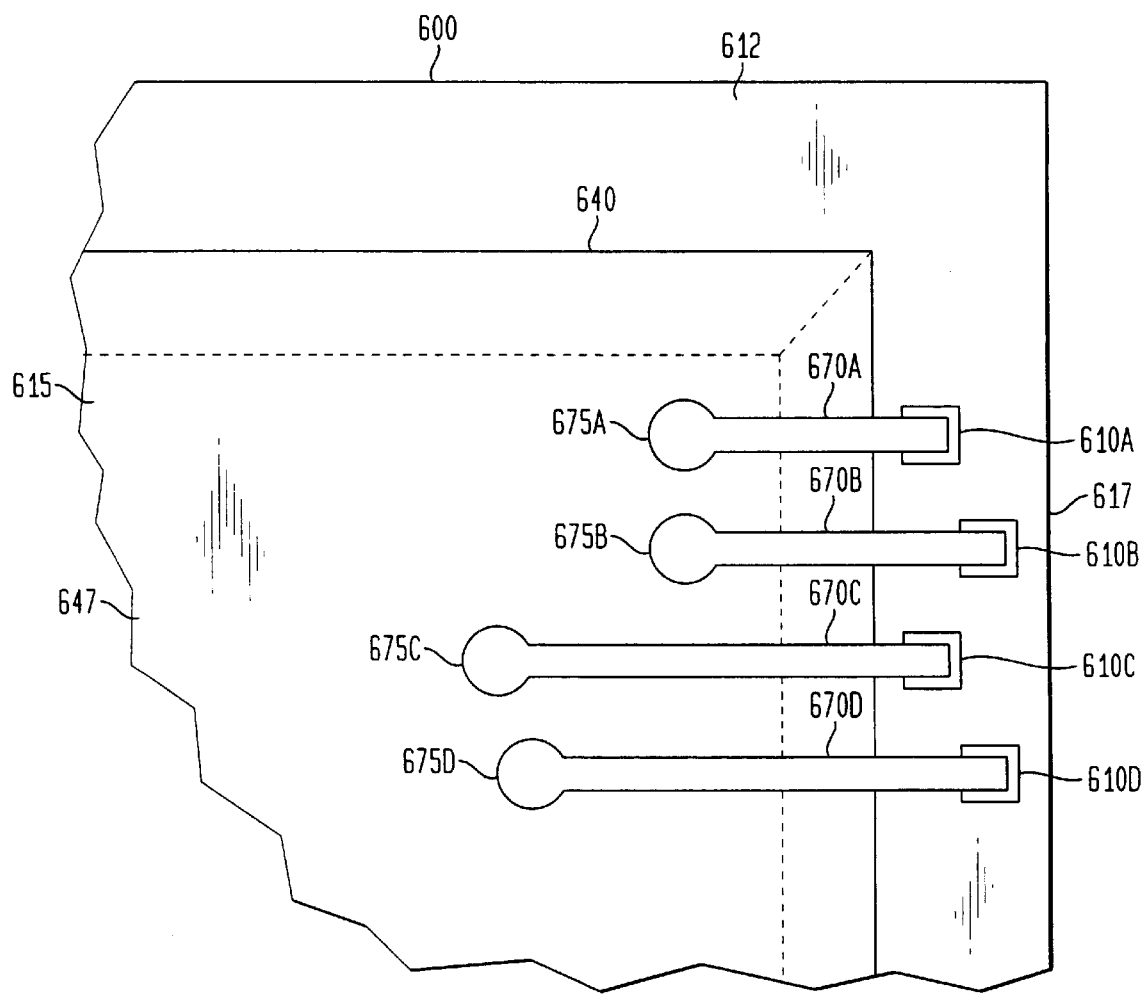
FIG. 12 is a fragmentary top view of the chip shown in FIG. 11 after a compliant layer and bond ribbons have been formed atop the chip.

The method steps described above are then utilized to provide a final compliant chip package, as shown in FIG. 12, whereby the contacts 610 are positioned at varying distances from the edge 617 of the chip 600. FIG. 12 shows four different contacts, designated 610A–610D, located in the peripheral region 612 of the chip 600. The contacts are staggered with respect to one another so that contacts 610B and 610D are closer to the edge 617 of the chip than contacts 610A and 610C. The contacts 610 are electrically connected to terminals 675 by bond ribbons 670. The actual length of bond ribbons 670 may vary based upon the position of the contact 610 and the desired position of the terminal 675. For example, although contacts 610A and 610C are positioned at a uniform distance from the edge 617 of the chip 600, bond ribbon 670C is longer than bond ribbon 670A. As a result, the terminal 675C connected to bond ribbon 670C may be positioned at a more central location than terminal 675A. The ability to modify the length of the bond ribbons 670 allows the terminals 675 to be positioned at an infinite number of different locations over the top surface 647 of the compliant layer 640 so that the chip package can be reliably interconnected with an external circuit element, regardless of the location of contact pads on the external circuit element.

Figure 13:
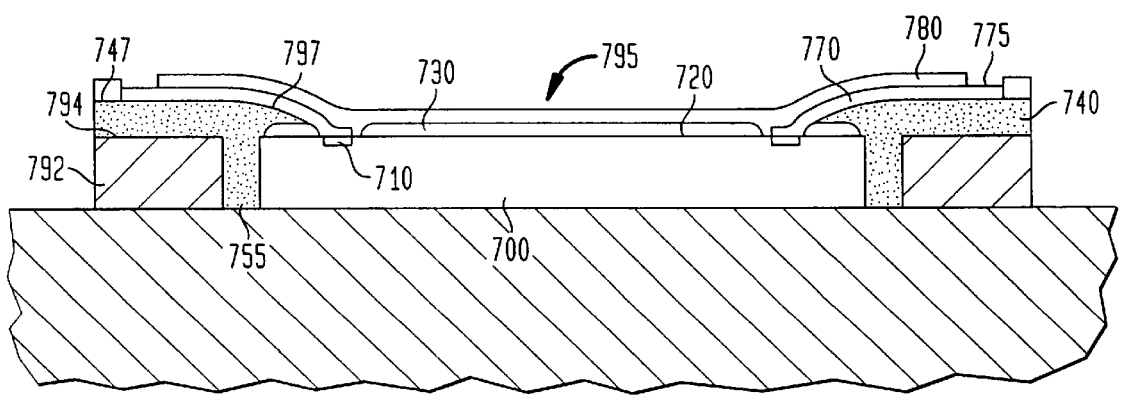
FIG. 13 is a cross-sectional view of a compliant chip assembly having a supporting element with a central opening and a semiconductor chip provided in the central opening of the supporting element in accordance with yet another embodiment of the present invention.

In a further embodiment, illustrated in FIG. 13, the compliant chip package includes a supporting element 792 adjacent a semiconductor chip 700, with conductive terminals 775 formed over a top surface 794 of the supporting element 792. The supporting element 792 may include a bar or alternatively a ring having an opening 795 in the center thereof. In the latter embodiment, the semiconductor chip 700 is provided within the opening 795 so that a first contact bearing surface 720 of the chip 700 is substantially parallel with the top surface 794 of the supporting element 792. The first surface 720 of the semiconductor chip 700 preferably includes a passivation layer 730 having openings therein so that the contacts 710 are accessible through the openings. A compliant layer 740 having a substantially flat top surface 747 and a bottom surface and sloping edges 797 therebetween is then formed atop the top surface 794 of the supporting element 792 and a portion of the passivation layer 730. The compliant layer 740 preferably fills gaps 755 between the peripheral edges of the chip 700 and the support element 792. In addition, the compliant layer 740 preferably has a meniscus-shaped top surface so that the transition from the passivation layer 730 to the compliant layer 740 is smooth. This smooth transition will increase the reliability of any bond ribbons formed atop the compliant layer because the bond ribbons will be gently curved rather than kinked. Next, bond ribbons 770 are formed using the techniques described above, and a dielectric layer 780 is formed over the bond ribbons 770 so that only conductive terminals 775 are accessible at the top of the assembly. In certain embodiments the supporting element 792 may include a heat sink and the compliant layer may be formed on the top surface of flanges extending laterally from central opening in the heat sink.

Figure 14:
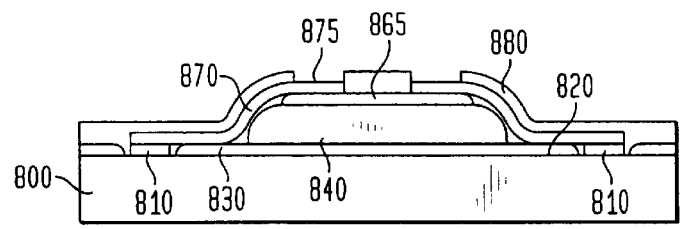
FIG. 14 is a cross-sectional view of a compliant chip assembly including a flexible dielectric sheet in accordance with still another embodiment of the present invention.

In still another embodiment, illustrated in FIG. 14, the compliant chip package includes a flexible dielectric sheet 865, such as a polyimide sheet, secured over the top of the compliant layer 840. The package includes a semiconductor chip 800 having a first surface 820 with contacts 810. A dielectric passivation layer 830, including openings in substantial alignment with the contacts 810, is then formed over the first surface 820 of the chip 800. After the compliant layer 840 has been formed, the flexible dielectric sheet 865 is provided over the top surface 847 of the compliant layer 840. The flexible dielectric sheet 865 generally improves the structural integrity of the package and protects the compliant layer 840 from external contaminants. Bond ribbons 870 are then formed atop the passivation layer 830, the compliant layer 840 and the flexible dielectric sheet 865. The bonds ribbons 870 have first ends which are connected to chip contacts 810 and second ends which provide conductive terminals 875 over the flexible dielectric sheet 865. In certain embodiments the dielectric sheet 865 is provided as a separate sheet which is laminated or secured over the top surface 847 of the compliant layer 840. In these embodiments, the conductive terminals 875 may be pre-formed on the dielectric sheet 865, with the bond ribbon forming step electrically interconnecting the contacts 810 and the pre-formed conductive terminals 875. In still further embodiments, the flexible dielectric sheet 865 may be spun onto the top surface 847 of the compliant layer 840. As such, the edges of the spun-on dielectric sheet have radii of curvature which substantially match the radii of curvature of the edges of the compliant layer. The matched edges provide a smooth transition from the dielectric sheet 865 to the compliant layer 840, thereby providing a more uniform surface for forming the bond ribbons 870. A second dielectric protective layer 880 may then be formed over the bond ribbons 870 to further protect the bond ribbons and electrically isolate the bond ribbons from one another.

Figure 15:
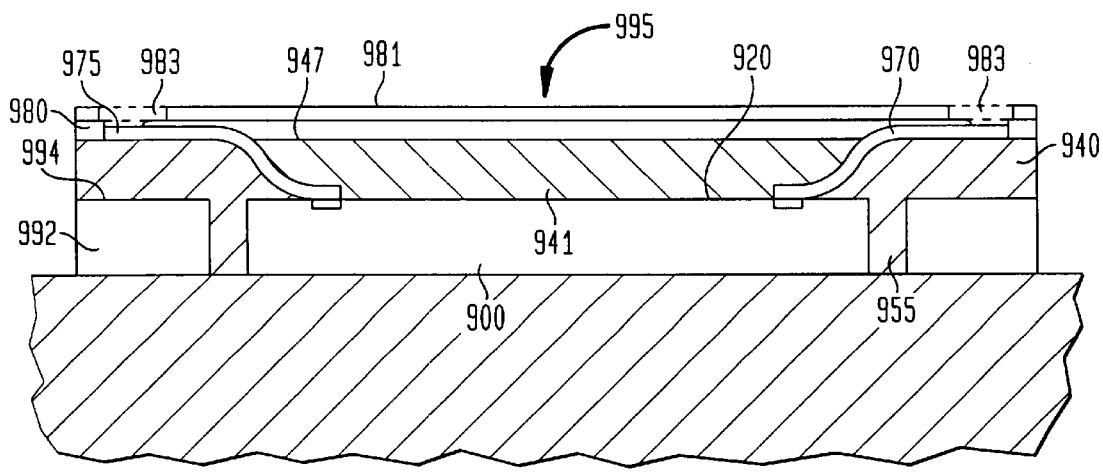
FIG. 15 is a cross-sectional view of a compliant chip assembly including a ground plane in accordance with a further embodiment of the present invention.
Figure 16:
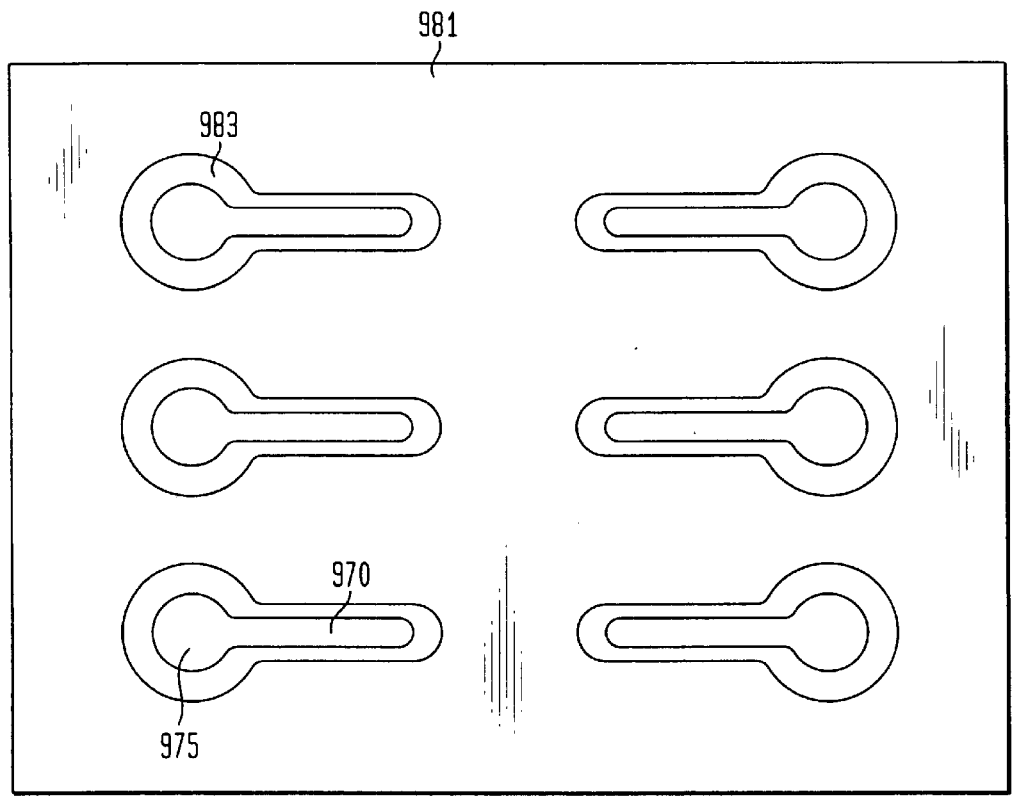
FIG. 16 is a fragmentary top view of the compliant chip assembly shown in FIG. 15.

In another embodiment, illustrated in FIGS. 15 and 16, a compliant chip package includes a ground plane 981. As shown in FIG. 15, a semiconductor chip 900 is provided within a central opening 995 of a supporting element 992 so that a first contact bearing surface 920 of the chip 900 is substantially parallel with a top surface 994 of the supporting element 992. A first compliant layer 940 having a substantially flat top surface 947 and a bottom surface and sloping edges 997 therebetween is then formed atop the top surface 994 of the supporting element 992. The compliant layer 940 preferably fills gaps 955 between the peripheral edges of the chip 900 and the support element 992. The sloping edges 997 preferably provide a smooth transition between the top surface 947 of the compliant layer 940 and the chip 900. Bond ribbons are then formed over the compliant layer 940 using the techniques described above. The sloping edges 997 of the compliant layer 940 will increase the reliability of the bond ribbons 970 because the bond ribbons will be gently curved rather than kinked. Next, a second compliant layer 941 is formed atop the bond ribbons 970 so as to encapsulate the bond ribbons 970. A dielectric layer 980 is then formed over the second compliant layer 941 and the bond ribbons 970 so that only conductive terminals 975 are accessible at the top of the assembly. The ground plane 981 is then provided atop the dielectric layer 980. Referring to FIG. 16, the ground plane preferably includes a highly conductive material, such as copper, having a plurality of openings therein. The openings are preferably formed using photolithographic and etching techniques. The openings are sized to fit over the terminals 975 and a relatively small portion of the bond ribbon 970 extending away from each terminal 975. The ground plane 981 is assembled to the dielectric layer by aligning the openings 983 therein with the terminals 975 and abutting the ground plane 981 against the top of the dielectric layer 980. The package is then subjected to a curing process so as to cure the compliant layers 940 and 941 and the dielectric layer 980.

Figure 17:
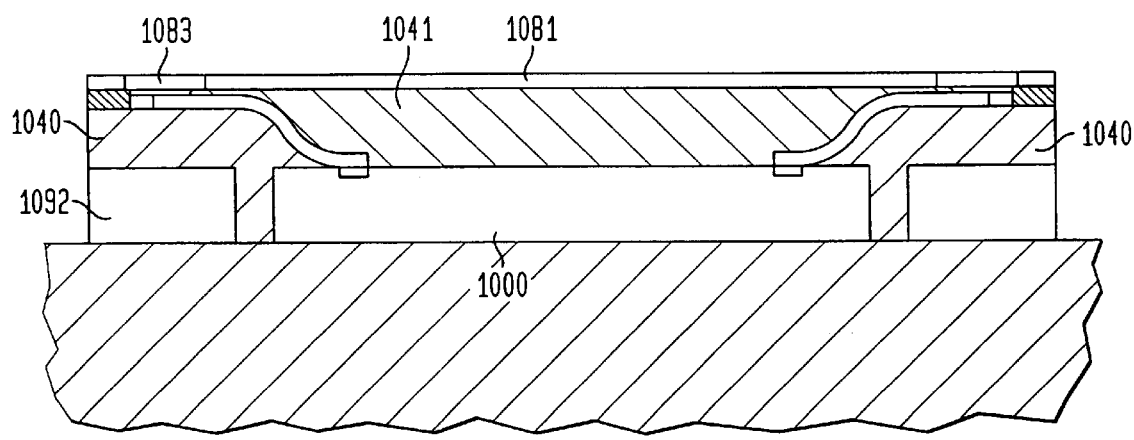
FIG. 17 is a cross-sectional view of a compliant chip assembly including a ground plane in accordance with still further embodiments of the present invention.

FIG. 17 shows yet another embodiment of a compliant chip package which is similar to that shown in FIG. 15, however, the FIG. 17 embodiment lacks the top dielectric cover layer shown in FIG. 15. Referring to FIG. 17, after the second compliant layer 1041 is formed atop the bond ribbons 1070, a ground plane 1081, similar to that shown in FIG. 16 is provided over the second compliant layer 1041. During assembly, the ground plane 1081 may be compressed against the second compliant layer 1041 so that the ground plane 1081 is slightly sunk into the second compliant layer 1041. The ground plane preferably includes openings 1083 which are in alignment with terminals 1075 so that the terminals 1075 are accessible through the openings 1083. The package is then subjected to a curing process so as to cure the compliant layers 1040 and 1041. The ground plane 1081 is preferably electrically connected to at least one of the bond ribbons 1070.

These and other variations and combinations of the features described above may be utilized without departing from the present invention as defined by the claims. For example, the low modulus encapsulant material shown in FIG. 4 may be used to assemble any of the compliant chip packages shown in FIGS. 7A–14 to provide additional stress relief for the bond ribbons. In addition, the assembly shown in FIG. 13 may be modified so as to provide conductive terminals over the central region of the chip, thereby providing a "fan-in/fan-out" compliant chip package. Moreover, all of the chip package assemblies disclosed above may be assembled on a wafer prior to severing the individual chips from the wafer. Thus, the foregoing description of the preferred embodiments should be taken by way of illustration rather than by way of limitation of the invention set forth in the claims.

As these and other variations and combinations of the features discussed above can be utilized without departing from the present invention as defined by the claims, the foregoing description of the preferred embodiments should be taken by way of illustration rather than by way of limitation of the invention set forth in the claims.

What is claimed is:

1. A microelectronic assembly comprising:
    a microelectronic element having a first surface including a central region and a peripheral region surrounding said central region, said microelectronic element including a plurality of contacts disposed in said central region;
    a compliant layer overlying said peripheral region of said first surface, said compliant layer having a bottom surface facing toward said first surface of said microelectronic element, a top surface facing upwardly away from the first surface of said microelectronic element and one or more edge surfaces extending between said top and bottom surfaces of said compliant layer; and
    a plurality of flexible bond ribbons disposed over said compliant layer so that said bond ribbons extend over said top surface and one or more of said edge surfaces and said bond ribbons electrically connect said contacts to conductive terminals overlying the top surface of said compliant layer.

2. The microelectronic assembly as claimed in claim 1, wherein said conductive terminals overlie the peripheral region of said microelectronic element.

3. The microelectronic assembly as claimed in claim 1, further comprising a first dielectric protective layer having a first surface, a second surface and apertures, wherein the first surface of said first dielectric layer is attached to the first surface of said microelectronic element and the apertures are aligned with the contacts of said microelectronic element so that the microelectronic element contacts are exposed.

4. The microelectronic assembly as claimed in claim 1, wherein said flexible bond ribbons are electrically conductive, each said bond ribbon having a top surface and a bottom surface, wherein each said bond ribbon extends along the edges of said compliant layer.

5. The microelectronic assembly as claimed in claim 4, further comprising an encapsulant layer attached to the top surfaces of said bond ribbons.

6. The microelectronic assembly as claimed in claim 5, wherein said encapsulant layer is selected from the group consisting of a curable liquid, silicone, flexibilized epoxy, thermoplastic and gel.

7. The microelectronic assembly as claimed in claim 1, wherein said conductive terminals bound the central region of said microelectronic element.

8. The microelectronic assembly as claimed in claim 1, wherein said compliant layer is selected from a group of materials consisting of silicone, flexibilized epoxy, a thermosetting epoxy, fluoropolymer, thermoplastic polymer and polyimide.

9. The microelectronic assembly as claimed in claim 1, further comprising a dielectric cover layer over the top surfaced of said compliant layer and said bond ribbons, wherein the dielectric cover layer has a plurality of apertures therein so that said terminals are accessible through said apertures.

10. The microelectronic assembly as claimed in claim 1, further comprising a barrier metal layer atop one or more of the contacts.

11. The microelectronic assembly as claimed in claim 1, wherein said microelectronic element includes a plurality of adjacent microelectronic elements arranged in an array to form a corresponding plurality of compliant semiconductor chip packages, said compliant layer including a plurality of regions, each said region overlying one said chip.

12. The microelectronic assembly as claimed in claim 1, wherein the edge surfaces of said compliant layer are sloping surfaces that extend in both vertical and horizontal directions.

13. The microelectronic assembly as claimed in claim 12, wherein at least some of said sloping edge surfaces have first transition regions near the top surface of said compliant layer and second transition regions near the bottom surface of said compliant layer, and wherein both the first and the second transition regions have respective radii of curvature.

14. A microelectronic assembly comprising:
    a semiconductor chip having a first surface including a plurality of peripheral chip contacts and a central region bounded by said peripheral chip contacts, wherein said peripheral chip contacts are positioned at varying distances from an outer edge of said chip;
    a compliant layer overlying the central region on the first surface of said semiconductor chip, wherein said compliant layer includes a top surface, a bottom surface and sloping peripheral edges;
    a plurality of electrically conductive bond ribbons, each said bond ribbon having a first end that electrically couples to a respective peripheral chip contact, a second send that electrically couples to a respective terminal overlying the top surface of said compliant layer, and an elongated portion that extends along the sloping edges between the first and second ends thereof; and
    an encapsulant layer overlying said bond ribbons.

15. The microelectronic assembly as claimed in claim 14, further comprising a first dielectric protective layer between said chip and said compliant layer having a first surface, a second surface and apertures, wherein the first surface of the first dielectric layer is attached to the first surface of said semiconductor chip and the apertures are aligned with the chip contacts so that the chip contacts are exposed.

16. The microelectronic assembly as claimed in claim 15, further comprising a second dielectric layer overlying the top surface of said compliant layer and said bond ribbons.

17. The microelectronic assembly as claimed in claim 14, wherein said terminals are positioned at non-uniform distances from peripheral edges of said semiconductor chip.

18. The microelectronic assembly as claimed in claim 14, wherein the peripheral edge of said compliant layer has a first transition region near the top surface of said compliant layer and a second transition region near the bottom surface of said compliant layer and wherein the first and second transition regions have a radius of curvature.

19. A microelectronic assembly comprising:
    a semiconductor chip having a first surface including a plurality of peripheral chip contacts and a central region bounded by said peripheral chip contacts, wherein said peripheral chip contacts are positioned at varying distances from an outer edge of said chip;

a compliant layer overlying the central region on the first surface of said semiconductor chip, wherein said compliant layer includes a top surface, a bottom surface and sloping peripheral edges;

a plurality of electrically conductive bond ribbons, each said bond ribbon having a first end that electrically couples to a respective peripheral chip contact, a second send that electrically couples to a respective terminal overlying the top surface of said compliant layer, and an elongated portion that extends along the sloping edges between the first and second ends thereof, wherein the lengths of at least two adjacent ones of said bond ribbons are non-uniform.

20. A compliant microelectronic assembly comprising:

a semiconductor chip having a first surface and a plurality of contacts disposed on the first surface thereof;

a supporting element bounding one or more edges of said semiconductor chip, said supporting element having a top surface;

a compliant layer formed over the top surface of said supporting element, said compliant layer including a top surface, a bottom surface and edges sloping from the top surface of said compliant layer to the first surface of said semiconductor chip;

conductive terminals overlying the top surface of said compliant layer;

flexible bond ribbons over the top surface of said compliant layer and extending on one or more of said sloping edge surfaces of said compliant layer, said bond ribbons electrically connecting said chip contacts and said conductive terminals.

21. The compliant microelectronic assembly as claimed in claim 20, wherein the top surface of said compliant layer is substantially flat.

22. The compliant microelectronic assembly as claimed in claim 20, wherein the first surface of said semiconductor chip and the top surface of said supporting element are substantially parallel to one another.

23. The compliant microelectronic assembly as claimed in claim 20, wherein a gap is present between said supporting element and the one or more edges of said semiconductor chip, and wherein a portion of said compliant layer fills said gap.

24. The compliant microelectronic assembly as claimed in claim 20, further comprising a dielectric layer overlying said bond ribbons, wherein said conductive terminals are accessible through openings in said dielectric layer.

25. The compliant microelectronic assembly as claimed in claim 20, wherein said supporting element is an element selected from the group consisting of a bar, a ring and a heat sink.

26. The compliant microelectronic assembly as claimed in claim 20, wherein the one or more sloping edges of said compliant layer have a first transition region near the top surface of said compliant layer and a second transition region near the first surface of said semiconductor chip, and wherein the first and second transition regions have radii of curvature for facilitating formation of gently curved bond ribbons for increasing the reliability of said bond ribbons and said assembly.

27. The compliant microelectronic assembly as claimed in claim 20, further comprising a passivation layer over the first surface of said semiconductor chip.

* * * * *

UNITED STATES PATENT AND TRADEMARK OFFICE
CERTIFICATE OF CORRECTION

PATENT NO.    : 6,465,878 B2
DATED         : October 15, 2002
INVENTOR(S)   : Joseph Fjelstad and Konstantine Karavakis It is certified that error appears in the above-identified patent and that said Letters Patent is hereby corrected as shown below:

Column 11,
Line 1, "FIG." should read -- FIGS. --

Column 18,
Line 3, "surfaced" should read -- surface --.
Line 40, "send" should read -- end --.

Column 19,
Line 10, "send" should read -- end --.

Signed and Sealed this

Eleventh Day of March, 2003

JAMES E. ROGAN
*Director of the United States Patent and Trademark Office*